United States Patent [19]

Aydil et al.

[11] Patent Number: 5,464,664
[45] Date of Patent: Nov. 7, 1995

[54] DOWNSTREAM AMMONIA PLASMA PASSIVATION OF GAAS

[75] Inventors: Eray S. Aydil, Summit; Konstantinos P. Giapis, Short Hills; Richard A. Gottscho, Maplewood, all of N.J.

[73] Assignee: AT&T IPM Corp., Coral Gables, Fla.

[21] Appl. No.: 204,792

[22] Filed: Mar. 1, 1994

Related U.S. Application Data

[63] Continuation of Ser. No. 899,557, Jun. 16, 1992, abandoned.

[51] Int. Cl.[6] ..................................................... B05D 3/06
[52] U.S. Cl. .......................... 427/535; 427/562; 427/573; 427/575; 437/228; 437/234
[58] Field of Search ...................................... 427/535, 562, 427/575, 573, 533, 523; 437/228, 234

[56] References Cited

U.S. PATENT DOCUMENTS

| | | | |
|---|---|---|---|
| 4,328,258 | 5/1982 | Coleman | 427/578 |
| 4,448,633 | 5/1984 | Shuskus | 427/573 |
| 4,705,760 | 11/1987 | Kaganowicz et al. | 437/234 |
| 4,859,253 | 8/1989 | Buchanan et al. | 437/235 |
| 5,179,029 | 1/1993 | Gottscho et al. | 427/569 |

FOREIGN PATENT DOCUMENTS

0441024  8/1991  European Pat. Off. .

OTHER PUBLICATIONS

P. W. Li et al. "Chemical and electrical characterization of AlGaAs/GaAs heterojunction bipolar transistors treated by electron cyclotron resonance plasmas" *Applied Physics Letters* vol. 60, No. 16, pp. 1996–1998 (1992) Apr.
C. Y. Wu et al. "C–V characteristics of Al/SiON/GaAs MIS systems" *Journal of the Electrochemical Society*, vol. 134, No. 5 pp. 1200–1204 (1987) May.
S. Cassette, et al. "Surface Analysis to Study the Improvements of Silicon Nitride/Gallium Arsenide Interface Properties", *Surface and Interface Analysis*, vol. 16, pp. 41–45 (1990) No month.
G. Beister, et al. "Capacitance–Voltage Dependence For Isotype AlGaAs/GaAs Heterointerfaces Comprising Rechangeable Traps", *Solid–State Electronics*, vol. 33, No. 2, pp. 227–233 (1990) No month.
C. A. Swarts, et al. "Reconstruction Of The (110) Surface Of III–V Semi–Conductor Compounds", *Surface Science* vol. 110 pp. 400–414 (1981) No month.
J. M. Moison, et al. "Stabilization and removal of the native oxides at the surface of (100)InP by low–pressure exposure to $NH_3$", *J. Appl. Phys.* 66 (8) pp. 3824–3838 (1989) Oct.
C. Y. Wu et al. "Influence of $NH_3$ plasma pretreatment on the properties of plasma enhanced chemical vapor deposited (List continued on next page.)

*Primary Examiner*—Marianne Padgett
*Attorney, Agent, or Firm*—Glen E. Books; Robert E. Rudnick

[57] ABSTRACT

Applicants have discovered that gallium arsenide surfaces can be dry passivated without heating or ion bombardment by exposing them downstream to ammonia plasma formation. Specifically, a workpiece having exposed gallium arsenide surfaces is passivated by placing the workpiece in an evacuable chamber, evacuating in the chamber, generating an ammonia plasma removed from the immediate vicinity of the workpiece, and causing the plasma products to flow downstream into contact with the workpiece. Preferably the plasma gas pressure is 0.5 to 6.0 Torr, the substrate temperature is less than 100° C. and the time of exposure is in excess of 5 min. The plasma should be generated at a location sufficiently removed from the workpiece that the workpiece surface is not bombarded with ions capable of damaging the surface (more than about 10 cm) and sufficiently close to the workpiece that reactive plasma products exist in the flow (within about 30 cm). The workpiece should also not be placed within line-of-sight of the plasma to avoid radiation (UV, visible and X-ray) induced damage. The result is fast, stable, room temperature passivation, compatible with clustered dry processing techniques for integrated circuit manufacture.

7 Claims, 4 Drawing Sheets

OTHER PUBLICATIONS

SiON on GaAs Interface", *J. Appl. Phys.* 60 (6) pp. 2050–2057 (1986). Sep.

N. Yoshida, et al. "UV Cleaning Effect of GaAs Surface in $NH_3$ Gas Prior to Photo CVD", Extended Abstracts of the 18th (1986 Int'l) Conf. on Solid State Devices and Materials, pp. 133–136 (1986) No month.

M. M. Moslehi, "Rapid Thermal/Plasma Processing For In–Situ Dielectric Engineering (Invited)", *Mat. Res. Soc. Sump. Proc.* vol. 92 pp. 73–87 No month (1987).

P. E. Bagnoli, et al. "Electrical characteristics of silicon nitride on silicon and InGaAs as a function of the insulator stoichiometry", *Applied Surface Science* 52, pp. 45–52 (1991) No month.

J. I. Pankove, et al. "Passivation of GaAs Surfaces", *J. of Electronics Materials*, vol. 12, No. 2, pp. 359–371 (1983) No month.

F. Capasso, "A Proposed Hydrogenation/Nitridization Passivation Mechanism for GaAs and Other III–V Semiconductor Devices, Including InGaAs Long Wavelength Photodectectors", *J. Electrochem. Soc.* vol. 129, pp. 821–824 (1982) Apr.

N. Proust, et al. "Electrical and Physical Properties of Pulsed 13,56 $MH_z$ Glow Discharge Si–N–H Films on GaAs and Si", Solid–State Electronics, vol. 33, Supp. pp. 277–232 (1990) No month.

K–H Kretschmer, et al. "Interelectrode Metal Migration on GaAs", *IEEE/IRPS*, pp. 102–106 (1987) No month.

Y. I. Nissim, et al. "High Temperature LPCVD of Dielectrics on III–V Substrates for Device Applications", pp. 173–176 No date, no source of the article.

DOWNSTREAM AMMONIA PLASMA PASSIVATION OF GAAS

This application is a continuation of application Ser. No. 07/899557, filed on Jun. 16, 1992, now abandoned.

FIELD OF THE INVENTION

This invention relates to surface passivation of III–V semiconductors by plasma processing. In particular it concerns downstream ammonia plasma passivation of GaAs. The process not only passivates GaAs surfaces with minimal surface damage but also passivates without heating.

BACKGROUND OF THE INVENTION

A major block to the advancement of GaAs device technology is the difficulty of passivating exposed GaAs surfaces. Unlike silicon, whose oxide passivates the silicon surface leaving a low density of interface states, gallium arsenide does not have a passivating native oxide. Indeed, the interface between GaAs and its native oxide can be laden with defects which create a large interface state density in the mid band gap. This large density produces a high recombination velocity and Fermi level pinning which, in turn, deteriorate device performance. Specifically, the large interface state density produces excessive leakage currents in field effect transistors and photodiodes.

Considerable efforts have been made to improve the poor electronic properties of GaAs surfaces and GaAs-insulator interfaces, but no wholly acceptable technique has yet been achieved. Wet processing techniques are generally incompatible with the trend in integrated circuit manufacturing toward clustered dry processing. The dry processing techniques thus far proposed, require either elevated temperatures incompatible with prior formed device structures or ion bombardment which is deleterious to the long term stability of the treated surface. Accordingly, there is a need for an improved process for dry plasma passivation of gallium arsenide surfaces without heating and ion bombardment.

SUMMARY OF THE INVENTION

Applicants have discovered that gallium arsenide surfaces can be dry passivated without heating or ion bombardment by exposing them downstream to ammonia plasma formation. Specifically, a workpiece having exposed gallium arsenide surfaces is passivated by placing the workpiece in an evacuable chamber, evacuating the chamber, generating an ammonia plasma removed from the immediate vicinity of the workpiece, and causing the plasma products to flow downstream into contact with the workpiece. Preferably the plasma gas pressure is 0.5 to 6.0 Torr, the substrate temperature is less than 100° C. and the time of exposure is in excess of 5 min. The plasma should be generated at a location sufficiently removed from the workpiece that the workpiece surface is not bombarded with ions capable of damaging the surface (more than about 10cm) and sufficiently close to the workpiece that reactive plasma products exist in the flow (within about 30cm). The workpiece should also not be placed within line-of-sight of the plasma to avoid radiation (UV, visible and X-ray) induced damage. The result is fast, stable, room temperature passivation, compatible with clustered dry processing techniques for integrated circuit manufacture.

BRIEF DESCRIPTION OF THE DRAWINGS

The advantages, nature and various additional features of the invention will appear more fully upon consideration of the illustrative embodiments now to be described in connection with the accompanying drawings. In the drawings.

It is to be understood that these drawings are for purposes of illustrating the concepts of the invention, and except for graphical illustrations, are not to scale.

DETAILED DESCRIPTION

Figure 1:
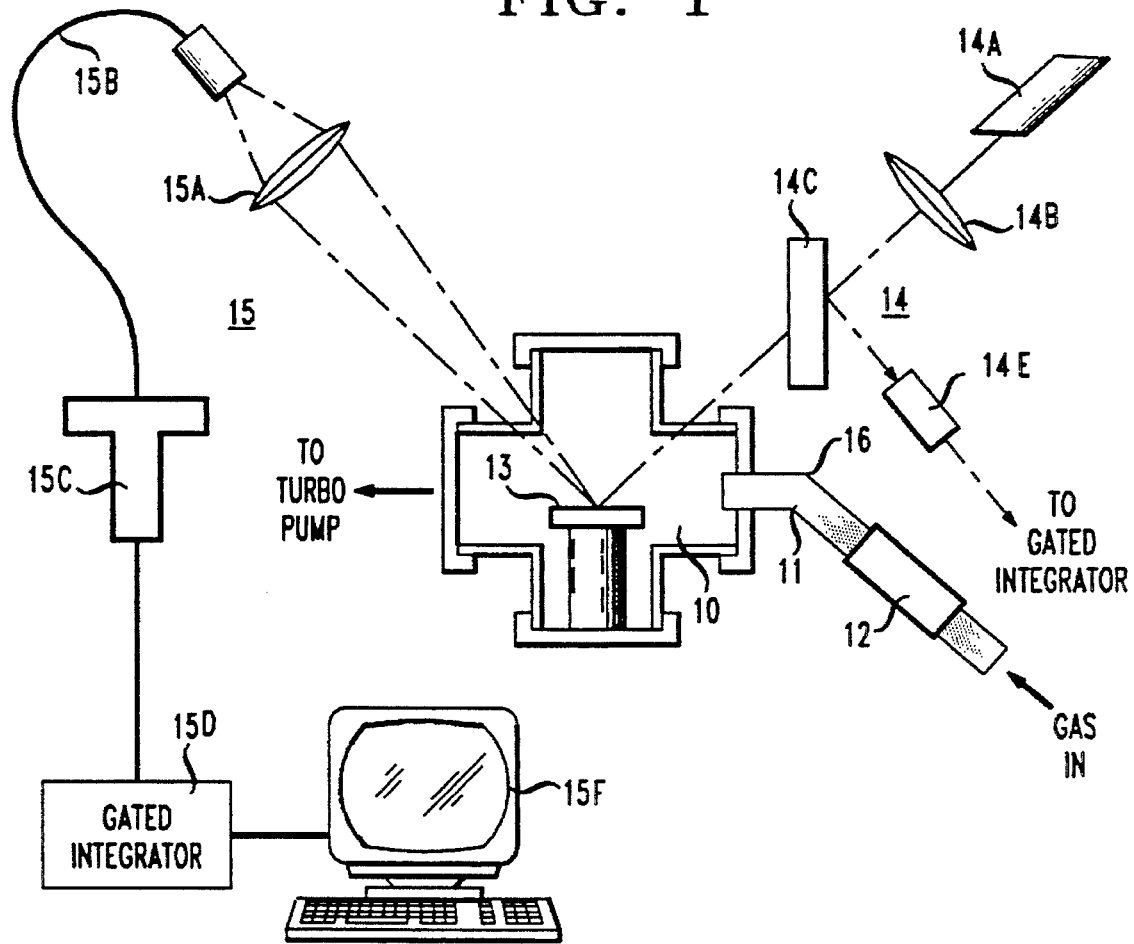
FIG. 1 is a schematic view of apparatus for treating a gallium arsenide surface in accordance with the invention.

Referring to the drawings, FIG. 1 is a schematic view of apparatus useful for treating a gallium arsenide surface in accordance with the invention. In essence, the apparatus comprises an evacuable chamber 10 disposed downstream from a gas input tube 11 enclosed within a microwave cavity 12. A workpiece 13 having an exposed gallium arsenide surface is disposed within chamber 10 where the surface is advantageously monitored by photoluminescence measuring equipment comprising a laser arrangement 14 and a photoluminescence detecting arrangement 15. In this embodiment the chamber 10 is conveniently a 6-way Pyrex cross. Input tube 11 is a 2.54cm diameter quartz tube enclosed in a 5cm microwave cavity resonant at 2.45GHz. The tube 11 has a bend 16 immediately after the microwave cavity to reduce the amount of radiation received by workpiece 13. The cavity should be sufficiently far removed from the workpiece that the plasma glow does not reach the workpiece. 10–30cm downstream is believed to be acceptable spacing.

Laser arrangement 14 preferably comprises a pulsed laser 14A, such as a Molectron 20 Hz $N_2$ pumped dye laser (600 mJ/cm$^2$ at 500 nm). Light from the laser passes through beam splitter 14B and one output beam is focussed by lens 14C onto workpiece 13.

Detecting arrangement 15 can comprise lens 15A for focussing photoluminescence from workpiece 13 into an optical fiber 15B which directs the light through a bandpass filter (not shown) to a photomultiplier tube 15C connected to a gated integrator 15D. The gate is controlled via photodiode 15E responsive to the second output beam from beam splitter 14B and the integrated output can be displayed on a personal computer 15F.

The workpieces 13 are typically semi-insulating or doped GaAs wafers. In preliminary steps, which are advantageous but not necessary for the success of passivation, the workpieces are dipped in HF for 30s, washed with dionized water, blow dried with nitrogen before loading into chamber 10.

Figure 2:
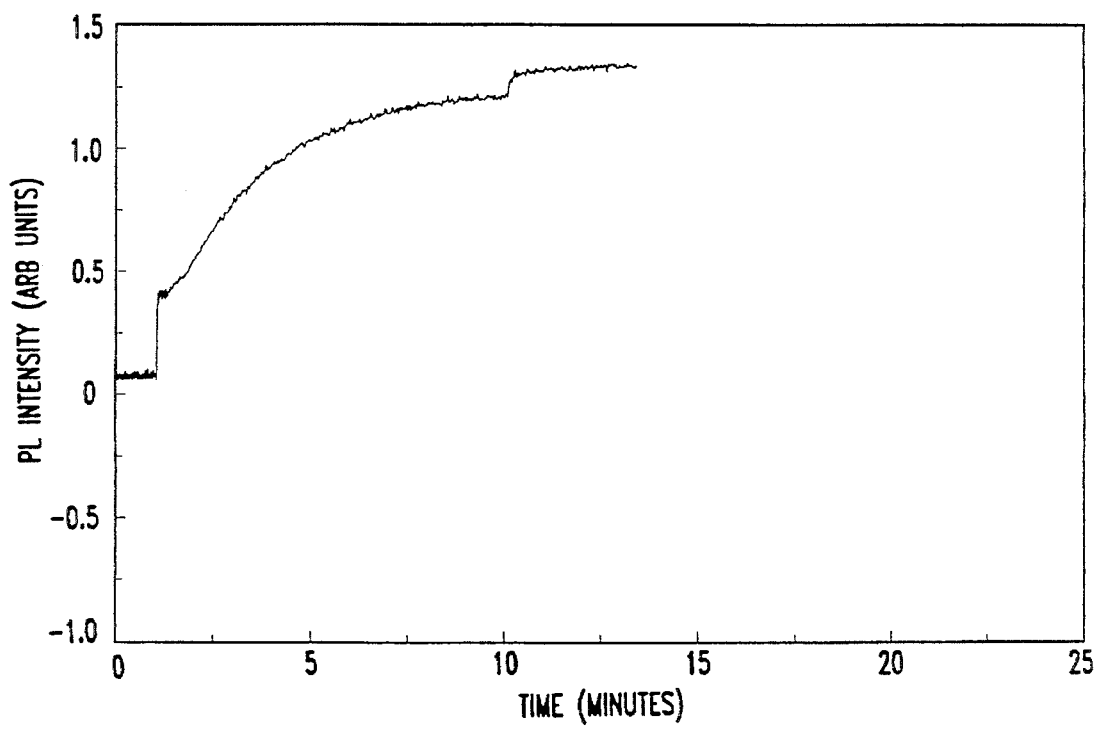
FIGS. 2–7 are graphical illustrations showing the effects of various parameters on the passivation process.

After loading, the chamber is evacuated to a low pressure less than about $10^{-6}$ Torr in order to remove potential contaminants. Ammonia is fed into tube 11 at a pressure of 0.5 to 6 Torr and microwave power is applied at 140 W. Gas flow is sufficient to maintain a steady supply of ammonia (10 sccm is adequate). The photoluminescent intensity ("PL intensity") is then observed to increase by a factor of ten within a minute of plasma turn-on and then to slowly increase to approximately twenty-five times the initial level after a few minutes depending on plasma gas pressure and power. The plasma and gas flow is then turned off, and the photoluminescent intensity increases abruptly to reach its final value. A typical PL intensity versus time plot for plasma gas at 1 Torr and microwave power at 140 W is shown in FIG. 2.

While the theory underlying this operation is not necessary for this invention, applicants' best current understanding is that hydrogen atoms are created in the plasma via electron impact dissociation of ammonia. These atoms are transported downstream via convection and diffusion to the GaAs surface where they chemisorb onto the surface and react with As and $As_2O_3$ to form $AsH_3$. The removal of As and $As_2O_3$ reduces arsenic antisite defects leading to the observed immediate increase in PL intensity.

The slow increase, following the initial rapid increase in PL, is believed to be due to plasma-assisted modification or formation of gallium oxide.

The sudden increase in PL intensity when the plasma is gated off is believed attributable to the rapid desorbtion of H atoms from the surface. The dynamic equilibrium between the surface and the H-containing gas over the surface is disturbed when the plasma is gated off, resulting in desorption of H atoms and reduction in any surface states due to the H atoms.

Figure 3:
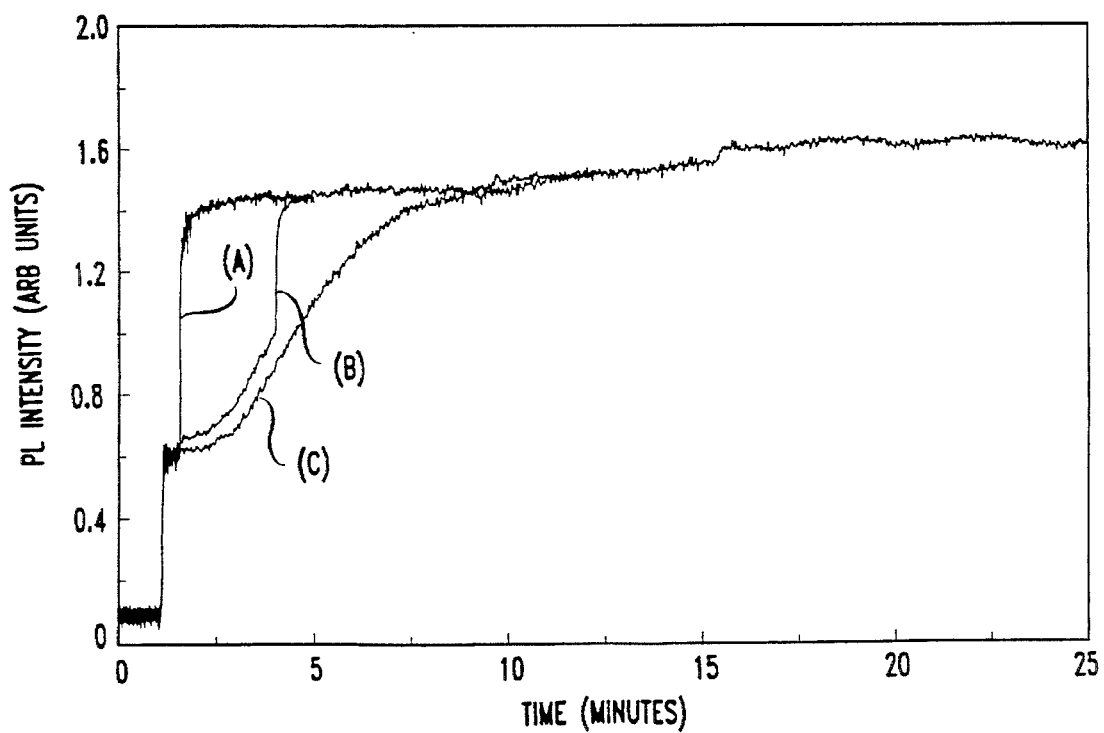

A variety of experiments were conducted to determine the effect of plasma exposure time, pressure, microwave power and ammonia flow rate. FIG. 3 is a graphical plot showing PL intensity versus exposure time for exposures of 30s (curve a), 240s (curve b), and 900s (curve c). The plasma was generated at 2 Torr and 140 W with 10 sccm ammonia flow rate. The graph shows that irrespective of when the plasma is turned off, the PL intensity jumps to the same final value. However, other tests show that the samples exposed a short time were less stable than the longer exposed samples. It is believed that during long exposure (in excess of about 5 minutes) gallium oxide forms on the surface, reducing the ability of H atoms chemisorbed on the surface to maintain surface states. At the end of about 15 minutes the gallium oxide reaches a final self-limiting thickness and passivates the GaAs surface. It is further believed that the presence of atomic hydrogen on the surface plays an essential role in the gallium oxide formation via the reaction:

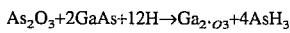

$$As_2O_3 + 2GaAs + 12H \rightarrow Ga_2 \cdot _{O3} + 4AsH_3$$

Figure 4:
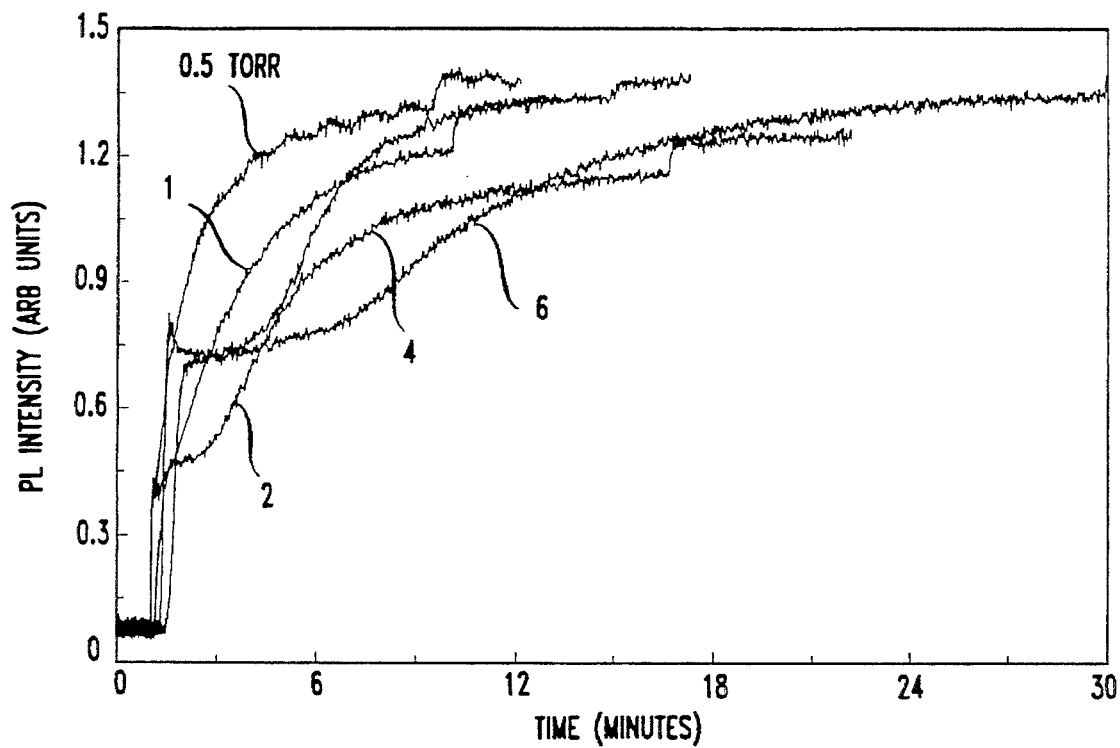

FIG. 4 is a graphical illustration of the PL intensity as a function of time for several different plasma pressures ranging from 0.5 Torr to 6 Torr when GaAs samples are treated with a downstream microwave ammonia plasma operating at 140 W and 10 sccm. As can be readily observed, passivation takes longer for higher pressures. This result is surmised to be due to a decrease in hydrogen atom concentration with increasing pressure. At higher pressures, fewer hydrogen atoms are brought downstream to the sample, and the passivation process therefore takes longer.

Figure 5:
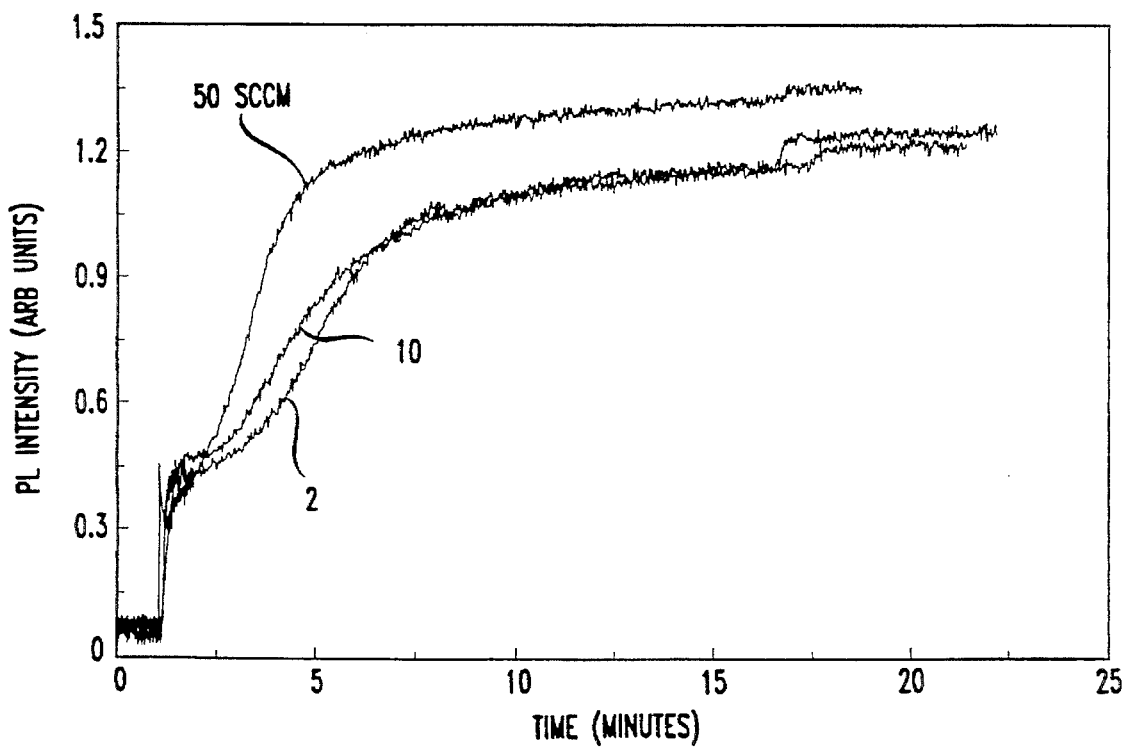

FIG. 5 shows the effect of ammonia flow rate (ranging from 2 sccm to 50 sccm) on passivation at 2 Torr and 140 W. As can be seen, passivation is faster at higher flow rates. This is consistent with the fact that at higher flow rates the flux of hydrogen atoms to the GaAs surface is higher.

Figure 6:
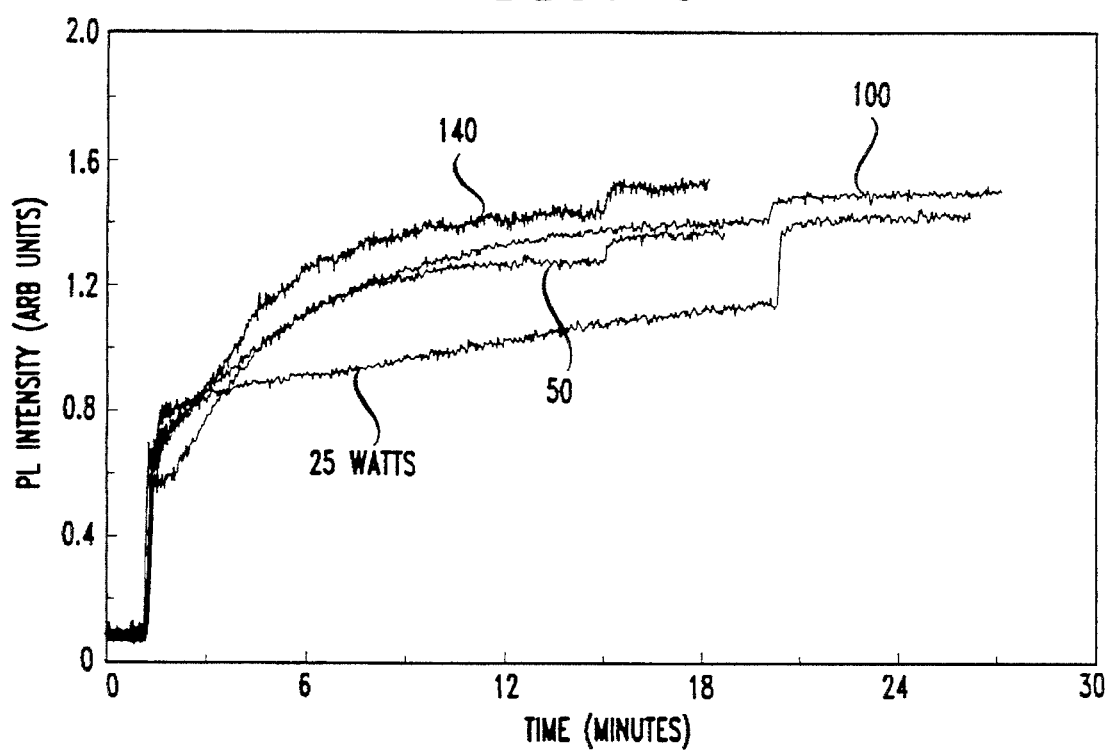

FIG. 6 shows the effect of microwave power on passivation. In the experimental ranges, the higher the power, the faster the passivation. This effect is believed due to the higher flux of hydrogen atoms at higher powers. Power in the range 75–140 W is believed to be optimal.

Figure 7:
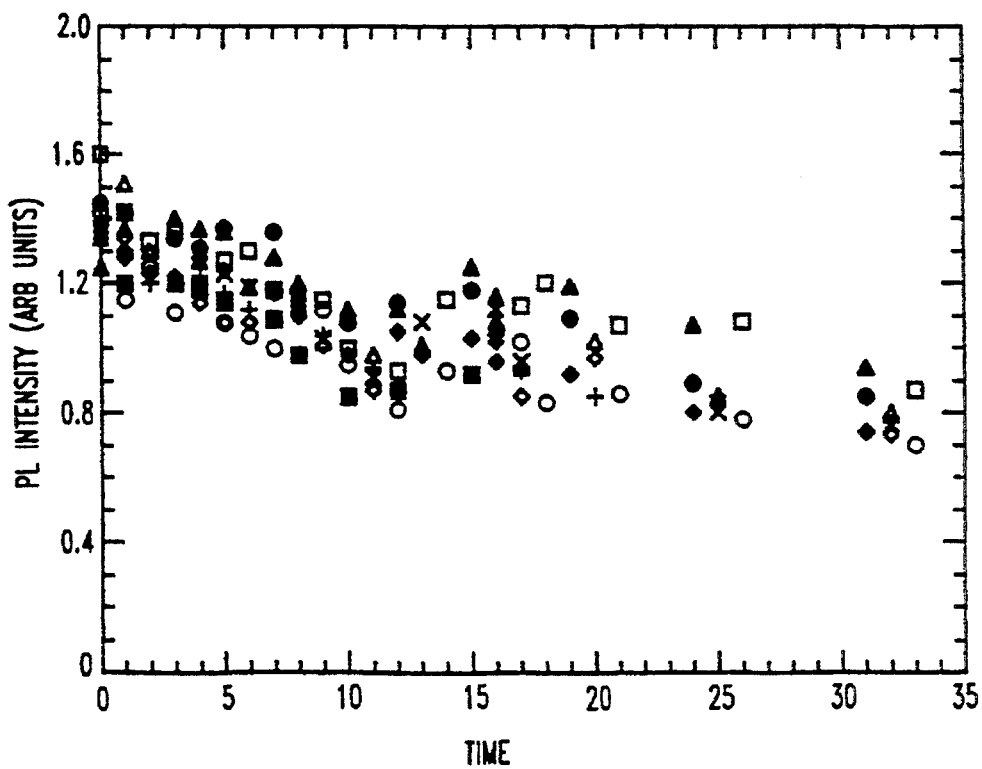

FIG. 7 is a graphical illustration showing the PL intensity for several samples as a function of time after treatment. Each of the samples was treated for 9 minutes or more, and the samples were kept in a dry box purged with dry nitrogen. The samples lost only about 40% of their PL intensity over a month, and this reduced intensity is still ten times the PL intensity for unpassivated GaAs. The PL intensity for samples kept in ambient air decays faster than for samples kept in a dry box.

The downstream ammonia passivation process offers numerous advantages over RF parallel plate passivation using hydrogen or ammonia. In the parallel plate process the GaAs surface is damaged by bombarding ions with the consequence that timing can be critical. Ion damage occurs rapidly after an initial maximum in PL, and even a few seconds delay in turning the plasma off reduces the final PL level attainable. In parallel plate passivation low pressures below about 0.5 Torr permit high energy ion bombardment of the GaAs surface which, in turn, damages the surface introducing new surface states. In addition, the ion bombardment damage is reflected in reduced stability. In two weeks RF $NH_3$ passivated samples kept in a dry box lost 70% of their PL intensity. This instability is believed attributable to voids and defects in the gallium oxide formed under ion bombardment. Such voids and defects permit oxygen atoms from ambient air to diffuse to the GaAs interface to form $As_2O_3$.

Thus downstream ammonia passivation can be carried out at room temperature without heating. As compared with RF parallel plate passivation, downstream ammonia passivation is less sensitive to exposure time and provides an enhanced stability passivation surface. Another advantage is that the sample can be overexposed to plasma effluents to ensure uniform passivation over larger areas (2"–3" wafers). This is unlike RF where overexposure would damage surface. In addition downstream passivation does not require electrodes which can be a source of contamination. The downstream process provides an inexpensive and efficient technique for passivation which can be clustered with existing dry processes.

It is to be understood that the above-described embodiments are illustrative of only a few of the many possible specific embodiments which can represent applications of the principles of the invention. Numerous and varied other methods can readily be devised in accordance with these principles by those skilled in the art without departing from the spirit and scope of the invention.

We claim:

1. A method for passivating GaAs surfaces comprising the steps of:

placing a workpiece comprising gallium arsenide within an evacuable chamber; evacuating said chamber maintaining said workpiece at a temperature of less than 100° C.;

forming an ammonia plasma at a location sufficiently removed from said workpiece such that said workpiece is not within the plasma glow and wherein said plasma is outside the line of sight to said workpiece to substantially protect said workpiece from ion bombardment and radiation damage; and causing products from said plasma to flow into contact with said workpiece for a time sufficient to increase photoluminescence intensity from said gallium arsenide by at least a factor of 10.

2. The method of claim 1, wherein said workpiece is exposed to said plasma products for a period in excess of five minutes.

3. The method of claim 1, wherein said workpiece is exposed to said plasma products for a period of 15 minutes or more.

4. The method of claim 1, wherein said plasma is formed 10–30cm from said workpiece.

5. The method of claim 1, wherein said plasma is formed from gas having a pressure in the range 0.5 to 6.0 Torr.

6. The method of claim 1, wherein said ammonia plasma is formed by introducing ammonia gas into a microwave resonant cavity supplied with microwave energy.

7. The method of claim 6, wherein said microwave energy is supplied at a rate of 75–140 W.

* * * * *